United States Patent [19]

Akerblom

[11] 3,959,034

[45] May 25, 1976

[54] METHOD OF PROVIDING AN OBJECT OF SILICON STEEL WITH A HEAT-RESISTANT, ELECTRICALLY INSULATING COATING

[75] Inventor: Carl-Artur Akerblom, Vasteras, Sweden

[73] Assignee: Allmanna Svenska Elektriska Aktiebolaget, Vasteras, Sweden

[22] Filed: Feb. 12, 1973

[21] Appl. No.: 331,382

[30] Foreign Application Priority Data

Mar. 1, 1972 Sweden .............................. 2575/72

[52] U.S. Cl. .................................. 148/113; 148/27; 148/31.5; 148/6.14 R; 427/126; 252/313 R

[51] Int. Cl.² ........................ H01F 1/04; H01L 3/00

[58] Field of Search ............... 148/113, 112, 111, 6, 148/6.14 R, 31.5 S, 27, 31.5; 117/222; 427/126, 127, 103, 129, 131; 252/313

[56] References Cited

OTHER PUBLICATIONS

Weiser, H. B., Inorganic Colloid Chemistry, Vol. II (1935), pp. 5 and 6, John Wiley & Sons, Inc.

*Primary Examiner*—John D. Welsh

[57] ABSTRACT

Electrical products formed of silicon steel are provided with a heat resistant electrical insulating coating by suspending particles of an oxide and/or of an hydroxide of earth alkali metal in an aqueous suspension, and adding to the suspension a substance capable of liberating hydroxyl ions which is volatile at a temperature below that at which silicate is formed. Examples of such a substance are ammonia and organic amines. There may also be added to the suspension silicon dioxide particles which are capable of oxidizing silicon to silicon dioxide at temperatures below 1300°C.

3 Claims, 1 Drawing Figure

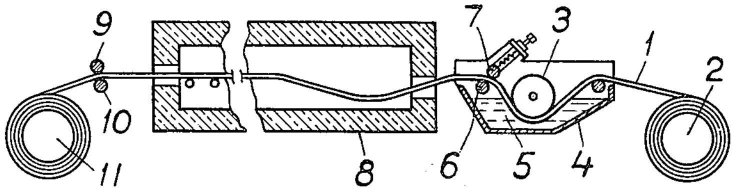
9
10
11
8
7
3
1
2
6
5
4

METHOD OF PROVIDING AN OBJECT OF SILICON STEEL WITH A HEAT-RESISTANT, ELECTRICALLY INSULATING COATING

BACKGROUND OF THE INVENTION

1. Field of the Invention

The invention relates to a method of providing an object of silicon steel with a heat-resistant, electrically insulating coating.

2. The Prior Art

It is known to provide sheet and strip of silicon steel, so-called electrical sheet and strip, with a heat-resistant electrically insulating coating in the form of a reaction product of silicon dioxide formed on the surface of the sheet and a metal oxide or hydroxide applied thereon. The application of such a protective layer on the surface of the sheet is usually performed by suspending an oxide or hydroxide of an earth alkali metal, especially of magnesium, in water and coating it on the sheet in the form of an even layer, after which the sheet material is heated to a temperature of about 1000°C – 1350°C in a hydrogen atmosphere for several hours. Simultaneously, the grain growth characteristic for the electric sheet takes place. The hydroxide, which is included in the suspension from the start, or which is formed from the oxide by reaction with water, liberates water during the heating of the sheet material which, at temperatures below that mentioned above, is capable of oxidizing silicon in the steel to silicon dioxide without the iron being oxidized at the same time. The oxide which is formed from the hydroxide during the liberation of water, or which has possibly been added from the start and has avoided hydration, reacts at about 1000°C – 1350°C with the silicon dioxide, thus forming a glass film on the surface of the sheet material. It is also possible to add particular additives to the water, which are capable of oxidizing silicon to silicon dioxide at higher temperatures. Of course, glass formation is performed also in this case. Any excess of the oxide of earth alkali metal, which has not reacted during the glass formation, acts as spacer material between adjacent layers of the sheet whether these occur as turns in a roll or as lamina in a stack, thus preventing the layers from sticking or sintering together.

SUMMARY OF THE INVENTION

According to the present invention, it has been found possible to achieve objects of silicon steel in the form of sheet or in another form, which are provided with a protective coating showing a considerably better insulating resistance than previously known protective coatings.

The present invention relates to a method of providing an object of silicon steel, such as in the form of sheet and strip for motors, generators and transformers and in the form of rods for magnetic cores, with a heat-resistant, electrically insulating coating by suspending particles of an oxide of an earth alkali metal and/or a hydroxide of an earth alkali metal in water and applying the suspension on the surface of the object and heating the object to a temperature which is required for the formation of silicate of the earth alkali metal on the surface of the object, characterised in that a substance capable of liberating hydroxyl ions is added to the suspension, said substance supplying the suspension with hydroxyl ions and being volatile at a temperature below the temperature at which silicate is formed.

As examples of suitable substances capable of liberating hydroxyl ions may be mentioned ammonia, organic amines, such as monoethanolamine, diethanolamine, triethanolamine and various alkylamines such as mono-, di- and trimethylamine and also mono-, di- and triethylamine. Since the substance capable of liberating hydroxyl ions is volatile at a temperature below that at which silicate is formed, it cannot influence the properties of the insulating coating unfavourably. The quantity of the compound liberating hydroxyl can amount to 1 – 25 per cent by weight of the total quantity of earth alkali compounds and hydroxyl liberating substance in the suspension.

It is important that the particles of the earth alkali compounds have a small grain size when they are applied on to the sheet, as this results in the particles adopting a great surface energy, making them more prone to react and giving the glass film an even quality. At least the main part of the particles should have a grain size less than 50 microns and the remainder a grain size less than 100 microns. Preferably, the main part of the particles have a grain size less than 10 microns and the remainder a grain size less than 50 microns.

As earth alkali metal magnesium is preferred, but also calcium, barium and strontium may be used.

A conceivable explanation of some of the effect obtained according to the present invention may be the following: If particles of an hydroxide or an oxide of an earth alkali metal are suspended in water, the larger particles will grow at the expense of the smaller because of the greater surface energy of the smaller particles. This results in the disappearance of small particles with greater surface energy and greater propensity for forming glass film being consumed from the suspension, and it also causes the size of the particles to become dependent on the age of the suspension. Even if, when preparing the suspension, a powder with an even grain size has been the starting material, the suspension cannot be prevented after some time from containing particles of strongly varying sizes. This results in an uneven quality of the glass film. Particularly great changes occur in oxides, because they are transformed at least partly into corresponding hydroxides during the suspension. The surface energy of the small oxide particles is lost in the form of heat. Besides the increase in grain size — which is unfavourable for the properties of the glass film — of particles which are suspended in water, a water suspension containing oxide is also disadvantageous in that its viscosity varies with the time, which makes it very difficult to achieve an even coating of the suspension on the sheet. Immediately after the preparation a considerable increase in the viscosity of the suspension occurs, which is probably due to the absorption of water on the surface of the particles. After this, the viscosity falls, probably because ions of the suspended oxide are formed. After another heavy increase in viscosity, which is presumably connected with precipication of hydroxide, the viscosity increases slightly with the time. This is probably due to a successively increasing size of the particles. Said changes in the viscosity are very difficult to balance when coating the sheet. If, according to the present invention, a substance is added to the suspension which supplies this with hydroxyl ions, it might be possible to force back the formation of earth alkali metal ions in the solution and thus prevent the unfavourable influence this may have on changes of the size of the particles and of the viscosity of the suspension. By doing so, small particles with great surface energy are maintained in this condition, which simplifies the glass formation and contributes to an even quality of the glass film.

As mentioned in the preamble, the hydroxide of earth alkali metal acts as oxidizing agent, so that silicon dioxide is formed on the sheet surface. It is, however, possible to add an extra additive to the suspension which is capable of achieving said oxidation. It is particularly suitable to make such an addition when the formed protective layer of silicate has a very close structure, as it has been found that the oxidation effected by the earth alkali hydroxide can then be insufficient.

The additive mentioned with the capacity to oxidize silicon to silicon dioxide may, among other things, consist of a metal oxide capable of being reduced to a lower oxide or to metal below 1300°C and/or a hydroxide of such a metal and/or a phosphate capable of being reduced to a phosphate with lower valency or to a phosphide at temperatures below 1300°C. As said metal chromium, manganese, vanadium, nickel, cobalt, copper, lead and tin are suitable. Examples of suitable compounds are $CrO_3$, $Cr_2O_3$, MnO, $MnO_2$, $KMnO_4$, $V_2O_5$, NiO, CoO, CuO, $PbO_2$, $SnO_2$, $Cr(OH)_3$, $Mn(OH)_2$, $Ni(OH)_3$, $Co(OH)_3$, $Mg_3(PO_4)_2$, $Ca_3(PO_4)_2$, $Mg_2P_2O_7$, $AlPO_4$. The quantity of additive is suitably 2 – 20 per cent by weight of the total amount of solid substances in the suspension.

In order to increase the thickness of the protective layer, silicon dioxide particles may be incorporated in the suspension. These will in fact also react with the earth alkali oxide at the temperature at which silicate is formed, which results in said increase in thickness. The quantity of $SiO_2$ supplied is suitably 1 – 16 per cent by weight of the total quantity of solid substances in the suspension.

The grain size of the additive capable of oxidizing silicon and of the added silicon dioxide should be such that the main part of the particles have a grain size less than 50 microns and the remainder a grain size less than 100 microns. Preferably, the main part of the particles have a grain size less than 10 microns and the remainder a grain size less than 50 microns.

The quantity of the particle material coated on the the sheet depends on the thickness of the sheet. In most cases, however, the total quantity of particulate material applied on the object, including any additive capable of oxidizing silicon and including any additional $SiO_2$ is about 3 – 30 g per $m^2$ of the surface of the object, irrespective of the type of silicon steel. When applying this quantity of the particulate material on objects of silicon steel with grain orientation and heating to the temperature required for the formation of glass, the thickness of the glass film is about 0.1 – 10 microns. Particulary favourable results are obtained with a thickness within the range 0.5 – 5 microns and a thickness of 0.5 – 1.5 microns is particularly preferred.

The protective layer according to the present invention can be applied on objects of silicon steel with grain orientation, as well as on objects of silicon steel without grain orientation. In the first-mentioned steel type the silicon content is normally about 3 per cent by weight and in the last-mentioned steel type within the range 0.3 – 5 per cent by weight.

The invention will be further explained be describing a number of embodiments with reference to the accompanying drawings, in which the FIGURE shows schematically a device for applying the protective layer according to the present invention.

In the drawing 1 designates a sheet of silicon steel. The sheet is drawn from a coil on a reel 2 and passes under a roll 3 which rotates in a pan 4 containing a suspension 5 of the particulate material with which the sheet is to be coated. The sheet is then passed between the wiping rollers 6 and 7, which are suitably covered with rubber, and into a furnace 8 where it is dried at a temperature of about 100°C for about 30 seconds before being wound up on the reel 11 after passing the transport rollers 9 and 10. The concentration of the particulate material is adjusted with respect to the profile of the rubber rollers 6 and 7 and to the roller pressure so that the desired layer thickness of the coated material is obtained. The coil is annealed at high temperature in a batch annealing furnace at about 1000°C – 1350°C in hydrogen atmosphere for several hours, whereupon the glass film is formed.

The suspension can also be applied by means of spraying.

In the examples below suitable compositions of the suspension 5 and its manufacture are indicated.

EXAMPLE 1

90 parts by weight magnesium oxide consisting of particles 95 per cent by weight of which have a grain size less than 5 microns and otherwise a grain size less than 25 microns is suspended in 1000 parts by weight water, to which 16 parts by weight 25 % (per cent by weight) ammonia is added. The suspension is coated after 2 hours by means of rolling on a cold-rolled sheet pretreated to give silicon steel with grain orientation and with a thickness of 0.3 mm according to the method described above. The suspension can also be sprayed on instead of rolled on the sheet.

EXAMPLE 2

90 parts by weight magnesium oxide having a grain size of less than 10 microns is suspended in 1000 parts by weight water. After 30 minutes 25 parts by weight of 25 % ammonia is added. After one hour the suspension is ready for coating on a cold-rolled sheet without grain orientation and with a thickness of 0.5 mm according to the method described above.

EXAMPLE 3

70 parts by weight magnesium oxide having a grain size of 5 microns is suspended in 1000 parts by weight water. After 30 minutes 7 parts by weight magnesium hydroxide having a grain size of 10 microns and 16 parts by weight of 25 % ammonia are added. After one hour the suspension is ready to be coated on a sheet of the kind indicated in Example 1 or 2 according to the method described above.

EXAMPLE 4

90 parts by weight magnesium oxide having a grain size of less than 10 microns is suspended in 1000 parts by weight water, to which 20 parts by weight monoethanolamine has been added. After two hours the suspension is ready to be coated on a sheet of the kind indicated in Example 1 or 2 according to the method described above.

EXAMPLE 5

90 parts by weight of magnesium oxide having a grain size of 1 – 3 microns is suspended in 1000 parts by weight water, to which 20 parts by weight triethanolamine has been added. After two hours the suspension is ready to be coated on a sheet of the kind indicated in Example 1 or 2 according to the method described above.

EXAMPLE 6

A suspension is prepared and applied in the manner indicated in Example 1, with the difference that 6 parts by weight manganese(IV)oxide (additive) having a grain size of 5 microns is incorporated in the suspension.

EXAMPLE 7

A suspension is prepared and applied in the manner indicated in Example 1, with the difference that 12 parts by weight $SiO_2$ having a grain size of 5 microns is incorporated in the suspension.

When a protective layer according to the invention has been applied on the sheet, this can be used as sheet and strip for motors, generators and transformers. If desired, an additional protective layer can be applied over the glass film. For example the sheet or strip may be treated with phosphoric acid or metal phosphates according to well-known methods, for example according to Swedish patent specification No. 129,585. Only one example will therefore be given here of a suitable method of applying a phosphate layer.

A sheet which has been treated in any of the ways described in Examples 1 – 7 is pickled with 10 per cent sulphuric acid for 15 – 30 seconds. When the sheet has been rinsed with water, a magnesium orthophosphate or other earth alkali metal phosphate is applied on the sheet in the form of an aqueous solution containing 100 g of magnesium orthophosphate per liter solution. The coating is then baked in a furnace at a temperature of 800° – 900°C for a period of 2 – 3 minutes, an outer metha-phosphate layer then being formed.

I claim:

1. Method of providing an object of silicon steel with a heat-resistant, electrically insulating silicate coating which comprises applying to the object a suspension in water of particles of at least one substance from the group of oxides and hydroxides of earth alkali metals, at least the main part of said particles having a grain size less than 10 microns and the remainder substantially a grain size less than 50 microns, in an amount to produce a coating having a weight of approximately 3–30 g per $m^2$ of the surface of the object and heating the object to a temperature of about 1000°C to 1350°C to form silicate of the earth alkali metal on the surface of the object, in which said suspension includes a substance capable of liberating hydroxyl ions selected from the group of ammonia and organic amines, said substance being present in the suspension in an amount constituting 1–25 per cent by weight of the total quantity of said particles and said substance capable of liberating hydroxyl ions, said substance being volatile at a temperature below the temperature at which silicate is formed.

2. Method according to claim 1, in which the earth alkali metal is magnesium.

3. Method according to claim 1, in which the substance liberating hydroxyl ions is selected from the group of monoethanolamine, diethanolamine and triethanolamine.

* * * * *